(12) United States Patent
Aziz et al.

(10) Patent No.: US 6,392,339 B1
(45) Date of Patent: May 21, 2002

(54) ORGANIC LIGHT EMITTING DEVICES INCLUDING MIXED REGION

(75) Inventors: Hany M. Aziz, Burlington; Zoran D. Popovic, Mississauga; Nan-Xing Hu, Oakville; Ah-Mee Hor, Mississauga, all of (CA)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/357,551

(22) Filed: Jul. 20, 1999

(51) Int. Cl.[7] .............................................. H05B 33/14
(52) U.S. Cl. ........................ 313/504; 313/503; 313/506; 427/66; 445/24; 428/690; 428/917
(58) Field of Search .................................. 313/498, 502, 313/503, 504, 506, 509; 428/690, 917, 212; 427/66

(56) References Cited

U.S. PATENT DOCUMENTS

| | | | | | |
|---|---|---|---|---|---|
| 5,059,862 | A | * | 10/1991 | VanSlyke et al. | 313/503 |
| 5,616,427 | A | * | 4/1997 | Tada | 313/504 |
| 5,709,959 | A | * | 1/1998 | Adachi et al. | 313/504 |
| 5,783,292 | A | * | 7/1998 | Tokito et al. | 313/504 |
| 5,925,980 | A | * | 7/1999 | So et al. | 313/504 |
| 5,955,836 | A | * | 9/1999 | Boerner et al. | 313/506 |
| 6,107,452 | A | * | 8/2000 | Miller et al. | 313/506 |
| 6,259,203 | B1 | * | 7/2001 | Kawamura et al. | 313/506 |

OTHER PUBLICATIONS

J. McElvain et al., Formation and Growth of Black Spots in Organic Light–Emitting Diodes, J. Appl. Phys. 80, pp. 6002–6007, (Nov. 1996).

W. Wen et al., Single–Layer Organic Electroluminescent Devices by Vapor Deposition Polymerization, Appl. Phys. Lett. 71, pp. 1302–1304, (Sep. 1997).

H. Aziz et al., Degradation Processes at the Cathode/Organic Interface in Organic Light Emitting Devices with MG:AG Cathodes, Appl. Phys. Lett. 72, pp. 2642–2644, (1998). (No month).

H. Aziz et al., Humidity–Induced Crystallization of Tris(8–Hydroxyquinoline) Aluminum Layers in Organic Light–Emitting Devices, Appl. Phys. Lett. 72, pp. 756–758, (1998). (No month).

* cited by examiner

Primary Examiner—Michael H. Day
Assistant Examiner—Mariceli Santiago
(74) Attorney, Agent, or Firm—Oliff & Berridge, PLC; Eugene O. Palazzo

(57) ABSTRACT

An organic light emitting device includes a mixed region composed of a mixture of a hole transport material and an electron transport material, one of which is an emitter. The organic light emitting device also includes at least one of a hole transport material region and an electron transport material region on the mixed region. An anode contacts the hole transport material region or the mixed region. A cathode contacts the electron transport material region or the mixed region. The hole transport material region and/or the electron transfer material region can be formed with a plurality of layers.

36 Claims, 7 Drawing Sheets

Prior Art

ORGANIC LIGHT EMITTING DEVICES INCLUDING MIXED REGION

BACKGROUND OF THE INVENTION

1. Field of Invention

This invention relates to the field of optoelectronic devices and, more particularly, to organic light emitting devices. This invention further relates to methods of forming the organic light emitting devices and displays using such devices.

2. Description of Related Art

Tang and Van Slyke reported efficient electroluminescence from a bilayer organic device in 1987. S. A. Van Slyke et al., "Organic light emitting Devices with Improved Stability," *Appl. Phys. Lett.* 69, pp. 2160–2162, 1996. Since that time, organic light emitting devices (OLEDs) have attracted great attention because of their potential toward the fabrication of large-area displays. See, J. R. Sheats et al, "Organic Electroluminescent Devices," *Science* 273, pp. 884–888, 1996; J. Salbeck, "Electroluminescence with Organic Compounds," *Ber. Bunsenges. Phys. Chem.* 100, pp. 1667–1677, 1996; and Z. Shen et al., "Three-Color, Tunable, Organic Light-Emitting Devices," *Science* 276, pp. 2009–2011, 1997.

To achieve efficient electroluminescence, some known organic light emitting devices include separate layers of a hole transport material (HTM) and an emitting electron transport material (ETM). The structure of such a conventional bilayer organic light emitting device 10 is shown in FIG. 1. The organic light emitting device 10 includes a substrate 12 composed of, for example, glass; an anode 14 on the substrate 12 and typically composed of a transparent conductor, for example, indium tin oxide (ITO); a hole transport material layer 16 on the anode 14; an electron transport material layer 18 on the hole transport material layer 16; and a cathode 20 on the electron transport layer 18 and typically composed of a low work function metal or metal alloy. During operation, an applied electric field causes positive charges (holes) and negative charges (electrons) to be respectively injected from the anode 14 and the cathode 20 to recombine and thereby produce light emission.

In some known organic light emitting devices, the hole transport and electron transport layers are doped with organic dyes in order to enhance the efficiency or to improve the stability of the organic light emitting devices. See the above-described Van Slyke et al. article and also Y. Hamada et al., "Influence of the Emission Site on the Running Durability of Organic Electroluminescent Devices," *Jpn. J. Appl. Phys.* 34, pp. L824–L826, 1995, and J. Shi et al., "Doped Organic Electroluminescent Devices with Improved Stability," *Appl. Phys. Lett.* 70, pp. 1665–1667, 1997.

There have also been attempts to obtain electroluminescence from organic light emitting devices containing mixed layers, i.e., layers in which both the hole transport material and the emitting electron transport material are mixed together in one single layer. See, for example, J. Kido et al., "Organic Electroluminescent Devices Based On Molecularly Doped Polymers," *Appl. Phys. Lett.* 61, pp. 761–763, 1992; S. Naka et al., "Organic Electroluminescent Devices Using a Mixed Single Layer," *Jpn. J. Appl. Phys.* 33, pp. L1772–L1774, 1994; W. Wen et al., *Appl. Phys. Lett.* 71, 1302 (1997); and C. Wu et al., "Efficient Organic Electroluminescent Devices Using Single-Layer Doped Polymer Thin Films with Bipolar Carrier Transport Abilities," *IEEE Transactions on Electron Devices* 44, pp. 1269–1281, 1997.

In many such structures, the electron transport material and the emitting material are the same. However, as described in the S. Naka et al. article, these single mixed layer organic light emitting devices are generally less efficient than multi-layer organic light emitting devices.

Moreover, the above-described references have not addressed the stability of these single mixed layer organic light emitting device structures. In fact, studies by the present inventors on organic light emitting devices structures including only a single mixed layer of a hole transport material (composed of NBP, a naphtyl-substituted benzidine derivative) and an emitting electron transport material (composed of Alq$_3$, tris (8-hydroxyquinoline) aluminum) have revealed that these known single mixed layer organic light emitting device structures are inherently unstable. The instability of these devices is believed to be caused by the direct contact between the electron transport material in the mixed layer and the hole injecting contact (comprised of indium tin oxide (ITO)), which results in the formation of the unstable cationic electronic transport material, as well as to the instability of the mixed layer/cathode interface. See, H. Aziz et al., *Science* 283, 1900 (1999), incorporated herein by reference in its entirety.

There have also been attempts to obtain electroluminescence from organic light emitting devices by introducing hole transport material and emitting electron transport material as dopants in an inert host material, as reported in the above-described article by J. Kido et al. However, such known devices have been found to be generally less efficient than conventional devices including separate layers of hole transport material and emitting electron transport material.

Known organic light emitting devices have relatively short operational lifetimes before their luminance drops to some percentage of its initial value. Although known methods of providing interface layers and doping have increased the operational lifetime of organic light emitting devices to several tens of thousands of hours for room temperature operation, the effectiveness of the known organic light emitting devices deteriorates dramatically for high temperature device operation, as the existing methods used to extend the device lifetimes lose their effectiveness at higher temperatures. In general, device lifetime is reduced by a factor of about two for each 10° C. increment in the operational temperature. As a result, the operational lifetime of known organic light emitting devices at a normal display luminance level of about 100 cd/m$^2$ is limited to about a hundred hours or less at temperatures in the range of 60–80° C. See the above-described article by J. R. Sheats et al. and also S. Tokito et al., *Appl. Phys. Lett.* 69, 878 (1996). These operational device lifetimes are unsatisfactory for use of the organic light emitting devices at these high temperatures, where an operational device lifetime in the order of several thousand hours is generally needed for various potential applications of organic light emitting devices.

SUMMARY OF THE INVENTION

This invention overcomes the above-described disadvantages of known organic light emitting devices (OLEDs) and provides improved organic light emitting devices having enhanced efficiency and operational lifetimes. In addition, the organic light emitting devices according to this invention can provide operational stability at high temperature device operation conditions.

Accordingly, the organic light emitting devices according to this invention can be used for various applications, and especially high-temperature technological applications that require high-temperature stability over significant lifetimes.

Exemplary embodiments of an organic light emitting device according to this invention comprise a mixed region comprising a mixture of a hole transport material and an electron transport material; one of the hole transport material and the electron transport material of the mixed region is an emitter. The organic light emitting device also comprises at least one of a hole transport material region and an electron transport material formed on the mixed region. In embodiments, an anode contacts either the hole transport material region or a surface of the mixed region, and a cathode contacts either the electron transport material region or another surface of the mixed region.

The organic light emitting devices according to the invention can be utilized in various devices such as displays that typically are operated over a broad range of temperature conditions. The operational stability at high temperature conditions provided by the organic light emitting devices of this invention enables embodiments to be used at high temperature applications for extended periods of time.

This invention also provides methods of forming the organic light emitting devices. One exemplary method according to exemplary embodiments of this invention comprises forming a mixed region comprising a mixture of a hole transport material and an electron transport material, one of which is an emitter. A hole transport material region and/or an electron transport material region is formed on the mixed region. An anode is formed in contact with either the hole transport material region or with a surface of the mixed region. A cathode is formed in contact with either the electron transport material region or with another surface of the mixed region.

BRIEF DESCRIPTION OF THE DRAWINGS

The preferred embodiments of this invention will be described in detail, with reference to the following figures, in which.

DETAILED DESCRIPTION OF PREFERRED EMBODIMENTS

This invention provides organic light emitting devices (OLEDs) having improved electroluminescence (EL) efficiency and operational lifetimes as compared to known organic light emitting devices. The organic light emitting devices according to this invention can be used in high temperature device operation and provide extended lifetimes at these high temperatures.

Figure 2:
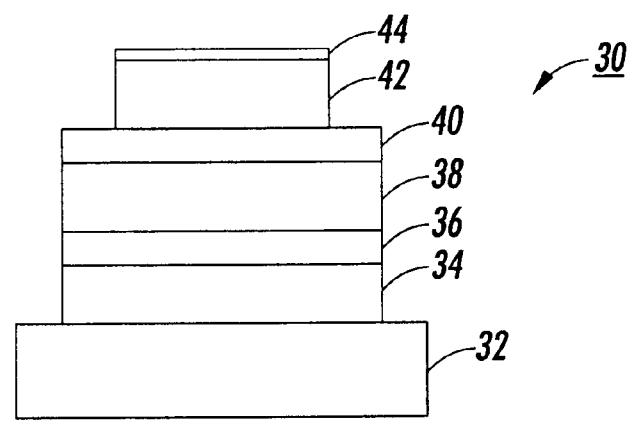
FIG. 2 illustrates an exemplary embodiment of an organic light emitting device according to this invention.

An exemplary embodiment of an organic light emitting device (OLED) 30 according to this invention is shown in FIG. 2. The organic light emitting device 30 comprises a substrate 32, an anode 34 on the substrate 32, a hole transport region 36 composed of a hole transport material (HTM) on the anode 34, a mixed region 38 comprising a mixture of a hole transport material and an electron transport material on the hole transport region 36, an electron transport region 40 composed of an electron transport material (ETM) on the mixed region 38, and a cathode 42 on the electron transport region 40. An optional protective layer 44 can be formed on the cathode 42. In the mixed region 38, one of the hole transport material and the electron transport material is an emitter.

In some exemplary embodiments of the organic light emitting devices according to this invention, only one of the hole transport region 36 or the electron transport region 40 is formed on the mixed region 38. That is, in embodiments of the organic light emitting devices that comprise the hole transport region 36 between the anode 34 and the mixed region 38, but do not also comprise the electron transport region 40 between the mixed region 38 and the cathode 42, the mixed region 38 is in contact with the cathode 42. In embodiments of the organic light emitting devices that comprise the electron transport region 40 between the mixed region 38 and the cathode 42, but do not also comprise the hole transport region 36 between the anode 34 and the mixed region 38, the mixed region 38 is in contact with the anode 34.

Figure 3:
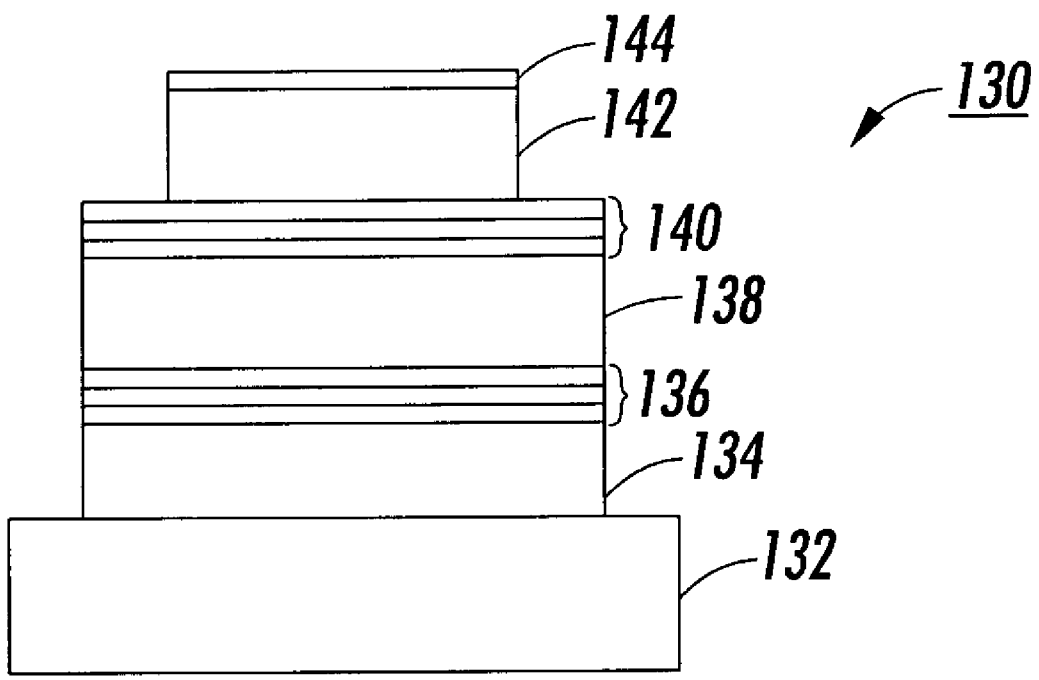
FIG. 3 illustrates an exemplary embodiment of an organic light emitting device according to this invention including multiple-layered hole transport and electron transport regions formed on the mixed region.

In some exemplary embodiments of the organic light emitting devices according to this invention, at least one of the hole transport region between the anode and the mixed region, and the electron transport region between the mixed region and the cathode, comprises a plurality of separate layers. FIG. 3 illustrates an exemplary embodiment of such an organic light emitting device 130 according to this invention that comprises a multiple-layered hole transport region 136 and a multiple-layered electron transport region 140 on the mixed region 138. The number of individual layers of the hole transport region 136 and the electron transport region 140 can be selectively varied. Typically, in such embodiments, the number of layers of either of these materials is from two to about ten. Preferably, the number of layers is two or three.

The multiple-layered hole transport region 136 and electron transport region 140 can improve the operational performance of the organic light emitting device 130. Particularly, these structures can improve the injection of the carriers into the mixed region 138, reduce the operating voltage and improve device stability.

In addition, the multiple-layered hole transport region 136 or the multiple-layered electron transport region 140 can be formed in embodiments of the organic light emitting devices of this invention that comprise only one of a hole transport region or an electron transport region formed in contact with the mixed region. That is, in embodiment of this invention, one or the other of the multiple-layered hole transport region 136 and the multiple-layered electron transport region 140 can be omitted from the organic light emitting device 130. Furthermore, in embodiments of this invention where both a hole transport region and an electron transport region are present in the organic light emitting device one of the hole transport region and the electron transport region can be a single-layer region, as shown in FIG. 2, and the other of the hole transport region and the electron transport region can be multiple-layer region, as shown in FIG. 3.

According to this invention, the hole transport material of the mixed region 38, 138 and the hole transport material of the hole transport region 36, 136 can be same material or a different material. Furthermore, the electron transport material of the mixed region 38, 138 and the electron transport material of the electron transport region 40, 140 can be the same material or a different material.

According to this invention, embodiments of the organic light emitting devices can be fabricated to emit light having a broad range of wavelengths. By selection of suitable combinations and mixtures of the hole transport material and the electron transport material of the mixed region 38, 138, light emission at wavelengths of from about 400 nm to about 700 nm can be achieved from the organic light emitting devices. Accordingly, the organic light emitting devices of this invention can emit light having a range of different colors by appropriate material selection. Thus, the organic light emitting devices of this invention can be used in various applications where certain specific light colors, such as red, green or blue are desired.

Various hole transport materials and electron transport materials are known in the art, as also is their combined selection to achieve desired color emissions. Furthermore, selection of such materials to provide a desired color emission can be readily conducted by one of ordinary skill in the art using routine experimentation.

According to this invention, embodiments of the organic light emitting devices can be operated under AC and/or DC driving conditions. As described in greater detail below, AC driving conditions are preferred in some embodiments to provide extended operational lifetimes.

The different portions of the organic light emitting devices according to this invention will now be described in greater detail.

The substrate 32, 132 can comprise various suitable materials including, for example, polymeric components, glass, quartz and the like. Suitable polymeric components include, but are not limited to polyesters such as MYLAR®, polycarbonates, polyacrylates, polymethacrylates, polysulfones, and the like. Mixtures of these various materials can also be used. Other substrate materials can also be selected provided, for example, that the materials can effectively support the other layers, and do not interfere with the device functional performance. Preferably, in embodiments, the substrate is formed of a light transmission material.

The thickness of the substrate 32, 132 is not particularly limited except by the structural demands of the organic light emitting device and its intended use. Suitable thicknesses include, for example, from about 25 $\mu$m to at least about 1,000 $\mu$m.

The anode 34, 134 formed on the substrate 32, 132 can comprise suitable positive charge injecting electrodes such as indium tin oxide (ITO), tin oxide, gold and platinum. Other suitable materials for the anode include, but are not limited to, electrically conductive carbon, $\pi$-conjugated polymers such as polyaniline, polypyrrole, and the like having, for example, a work function equal to, or greater than, about 4 eV, and preferably from about 4 eV to about 6 eV.

The anode 34, 134 can be of any suitable form. A thin conductive layer can be coated onto a light transmissive substrate, for example, a transparent or substantially transparent glass plate or plastic film. Embodiments of the organic light emitting devices according to this invention can comprise a light transmissive anode formed from tin oxide or indium tin oxide (ITO) coated on a glass plate. Also, very thin light-transparent metallic anodes having a thickness, for example, of less than about 200 Å, and, preferably, from about 75 Å to about 150 Å can be used. These thin anodes can comprise metals such as gold, palladium and the like. In addition, transparent or semi-transparent thin layers of conductive carbon or conjugated polymers such as polyaniline, polypyrrole and the like, having a thickness of, for example from 50 Å to about 175 Å can be used as anodes. Additional suitable forms of the anode 34, 134 (and the cathode 42, 142) are disclosed in U.S. Pat. No. 4,885,211, incorporated herein by reference in its entirety.

The thickness of the anode 32, 132 can range from about 1 nm to about 500 nm, with the preferred range depending on the optical constants of the anode material. One preferred range of thickness of the anode is from about 30 nm to about 300 nm. Of course, thicknesses outside of this range can also be used.

The hole transport material used to form the hole transport region 36, 136 and the mixed region 38, 138 can be any suitable known or later developed material. Suitable hole transport materials include, for example, but are not limited to, conductive materials such as polyaniline and its acid-doped forms, polypyrrole, poly(phenylene vinylene), and known semiconductive organic materials; porphyrin derivatives such as 1,10,15,20-tetraphenyl-21H,23H-porphyrin copper (II) disclosed in U.S. Pat. No. 4,356,429, incorporated herein by reference in its entirety; copper phthalocyanine, copper tetramethyl phthalocyanine; zinc phthalocyanine; titanium oxide phthalocyanine; magnesium phthalocyanine; and the like. Mixtures of these and other suitable materials can also be used.

A preferred class of hole transporting materials are the aromatic tertiary amines such as those disclosed in U.S. Pat. No. 4,539,507, which is incorporated herein by reference in its entirety. Suitable exemplary aromatic tertiary amines include, but are not limited to, bis(4-dimethylamino-2-methylphenyl)phenylmethane, N,N,N-tri(p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, mixtures thereof and the like.

Another class of aromatic tertiary amines selected for the hole transporting layer is polynuclear aromatic amines. Examples of such polynuclear aromatic amines include, but are not limited to, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like.

A preferred class of hole transporting materials is comprised of 4,4'-bis(9-carbazolyl)-1,1'-biphenyl compounds of the formula

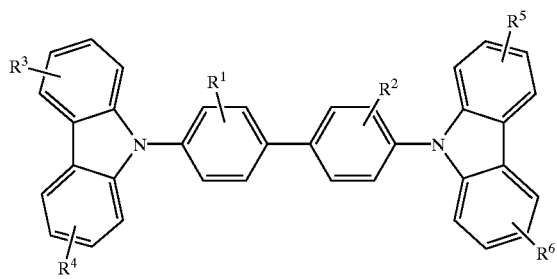

wherein $R^1$ and $R^2$ are independently a hydrogen atom or an alkyl group of for example from 1 to about 3 carbon atoms; $R^3$ through $R^6$ are substituents independently selected from the group consisting of hydrogen, alkyls with preferably from about 1 to about 6 carbon atoms, alkoxyls with from about 1 to about 6 carbon atoms, a halogen atom, dialkylamino groups, aryls, and the like. Illustrative examples of 4,4'-bis(9-carbazolyl)-1,1'-biphenyl compounds include 4,4'-bis(9-carbazolyl)-1,1'-biphenyl and 4,4'-bis(3-methyl-9-carbazolyl)-1,1'-biphenyl, and the like.

A preferred class of hole transport materials are comprised of N,N,N'N'-tetraarylbenzidines, wherein aryl may be selected from phenyl, m-tolyl, p-tolyl, methoxyphenyl, p-methoxyphenyl, 1-naphthyl, 2-naphthyl and the like. Illustrative examples of N,N,N'N'-tetraarylbenzidine are N,N;-di-1-naphthyl -N,N'-diphenyl-1,1'-biphenyl-4,4'-diamine, which is more preferred; N,N'-bis(3-methylphenyl)-N,N'diphenyl-1,1'-biphenyl-4,4'-diamine; N,N'-bis(3-methoxyphenyl)-N,N'-diphenyl-1,1'-biphenyl-4,4'-diamine, and the like.

A preferred hole transport material are the naphtyl-substituted benzidine derivatives.

The hole transport material of the hole transport region 36, 136 can be prepared by forming one of the above-described materials into thin films by any suitable known or later developed method. Suitable methods for this purpose include, for example, vapor deposition and spin-coating techniques.

The hole transport region 36 can comprise a hole transport material with a thickness ranging from about 5 nm to about 500 nm. Preferably, this thickness is from about 20 nm to about 80 nm. Of course, thicknesses outside of these ranges can be also be used. In embodiments such as the organic light emitting device 136 comprising a multiple-layered hole transport region 136, the individual layers have a thickness of at least about 5 nm.

Illustrative examples of electron transport materials that can be utilized in the mixed region 38, 138 and the electron transport region 40, 140, include, but are not limited to, the metal chelates of 8-hydroxyquinoline as disclosed in U.S. Pat. Nos. 4,539,507; 5,151,629; 5,150,006 and 5,141,671, each incorporated herein by reference in its entirety. Illustrative examples include tris(-8-hydroxyquinolinate) aluminum (Alq$_3$), which is a preferred electron transport material, tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h]quinolinate) beryllium, and the like.

Another preferred class of electron transport materials, which are preferably used in electron transport region 38, 138 comprises stilbene derivatives, such as those disclosed in U.S. Pat. No. 5,516,577, incorporated herein by reference in it entirety. A preferred stilbene derivative is 4,4'-bis(2,2-diphenylvinyl)biphenyl.

Another class of preferred electron transport materials are the metal thioxinoid compounds, illustrated in U.S. Pat. No. 5,846,666, incorporated herein by reference in its entirety. These materials include metal thioxinoid compounds of bis(8-quinolinethiolato)zinc, bis(8-quinolinethiolato) cadmium, tris(8-quinolinethiolato)gallium, tris(8-quinolinethiolato)indium, bis(5-methylquinolinethiolato) zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo {f}-8-quinolinethiolato]zinc, bis[3-methylbenzo {f}-8-quinolinethiolato]zinc, bis[3,7-dimethylbenzo {f}-8-quinolinethiolato]zinc, and the like. Preferred materials are bis(8-quinolinethiolato)zinc, bis(8-quinolinethiolato) cadmium, tris(8-quinolinethiolato)gallium, tris(8-quinolinethiolato)indium and bis[benzo {f}-8-quinolinethiolato]zinc.

Another class of suitable electron transport materials for forming the electron transport region 40, 140 and the mixed region 38, 138 are the oxadiazole metal chelates disclosed in copending application, U.S. patent application Ser. No.

08/829,398, filed Mar. 31, 1997, incorporated herein by reference in its entirety. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato]beryllium, and the like.

According to this invention, the mixed region 38, 138 can comprise from about 10 wt. % to about 90 wt. % of the hole transport material and from about 90 wt. % to about 10 wt. % of the electron transport material. Preferably, the mixed region 38, 138 comprises from about 30 wt. % to about 70 wt. % of the hole transport material and from about 70 wt. % to about 30 wt. % of the electron transport material. Another preferred range is from about 40 wt. % to about 60 wt. % of the hole transport material and from about 60 wt. % to about 40 wt. % of the electron transport material. The mixed region can be formed using mixtures of any of the suitable exemplary hole transport materials and electron transport materials described above.

The mixed region 38, 138 can be formed by any suitable method that enables the formation of selected mixtures of hole transport materials and electron transport materials. For example, the mixed region can be formed by co-evaporating a hole transport material and an electron transport material to form a mixed region.

The thickness of the mixed region 38, 138 can vary from about 10 nm to about 200 nm. As described further below, reducing the thickness of the mixed region lowers the operational voltage and also the luminance (and EL efficiency) of the organic light emitting devices of this invention. However, thicknesses outside of this range can also be used, as desired.

In embodiments of the organic light emitting devices according to this invention, the mixed region 38, 138 can comprise more than one layer. For example, the mixed region 38, 138 can selectively be formed to include two, three or even more separate layers. In such embodiments, the mixing ratios of the hole transport material and the electron transport material can be the same in each of the layers or the mixing ratios can be varied. For example, the multiple layers can each comprise 50 wt. % of the hole transport material and 50 wt. % of the electron transport material. In other embodiments, for example, the mixed region can comprise more or less than 50 wt. % of either of these materials.

The cathode 42, 142 can comprise any suitable metal, including high work function components, having a work function, for example, from about 4.0 eV to about 6.0 eV, or low work function components, such as metals with, for example, a work function of from about 2.5 eV to about 4.0 eV. The cathode can comprise a combination of a low work function (less than about 4 eV) metal and at least one other metal. Effective proportions of the low work function metal to the second or other metal are from less than about 0.1 wt. % to about 99.9 wt. %. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are preferred low work function metals.

The Mg-Ag alloy cathodes of U.S. Pat. No. 4,885,211 are one preferred cathode construction. Another preferred cathode construction is described in U.S. Pat. No. 5,429,884, wherein the cathodes are formed from lithium alloys with other high work function metals such as aluminum and indium. This latter patent is incorporated herein by reference in its entirety.

The thickness of the cathode 42, 142 can range from, for example, about 10 nm to about 500 nm. Of course, thicknesses outside of this range can also be used.

The optional protective layer 44, 144 can comprise any suitable metal such as silver, gold, or non-conductive materials such as silicone oxide and the like.

The following examples are provided to further illustrate various aspects of this invention, and are not intended to limit the scope of the invention.

EXAMPLES

A naphtyl-substituted benzidine derivative, N,N'-di-1-naphthyl-N,N'-diphenyl-1,1'-biphenyl-1,1'-biphenyl-4,4'-diamine (NPB), and tris (8-hydroxyquinoline) aluminum (Alq$_3$) were used as the hole transport material and the emitting electron transport material, respectively, to form organic light emitting devices. Organic light emitting devices having a structure such as the device 30 shown in FIG. 2 were formed and evaluated. The organic light emitting devices comprised a mixed region of NPB and Alq$_3$ having a thickness of about 80 nm. The mixed region functioned as both a charge transport layer and an emitting layer, due to the presence of both a hole transport material and an electron transport material. The mixed region was formed between thin layers of NPB and Alq$_3$, respectively, each having a thickness of about 20 nm. The NPB layer and the Alq$_3$ layer acted as hole-injection and electron-injection regions, respectively. The hole-transport region, the mixed layer and the electron-transport region were formed between an anode comprised of indium-tin-oxide (ITO) having a thickness of about 200 nm, and a cathode comprised of a Mg:Ag (10:1) alloy having a thickness of about 120 nm. The cathode was coated with a protective Ag layer having a thickness of about 80 nm.

The organic light emitting devices were fabricated using a vacuum evaporation process at a pressure of about 6×10$^{-6}$ torr. The mixed region was produced by co-evaporation of pure NPB and Alq$_3$ from separate sources, with the single evaporation rates being varied between about 0.2–10A/s to obtain the desired mixing ratio of the mixed region.

Following formation of the organic hole transport region, the mixed region and the electron transport region, the metal cathode was deposited on the electron-transport region without breaking the vacuum.

The organic light emitting devices that were formed were evaluated to determine their current density (J) versus voltage (V) and luminance (L) versus current density (J) characteristics, using a Keithly 238 unit and a calibrated photodiode.

The operational lifetime was tested with the organic light emitting devices operated in dry air under constant current conditions.

Figure 1:
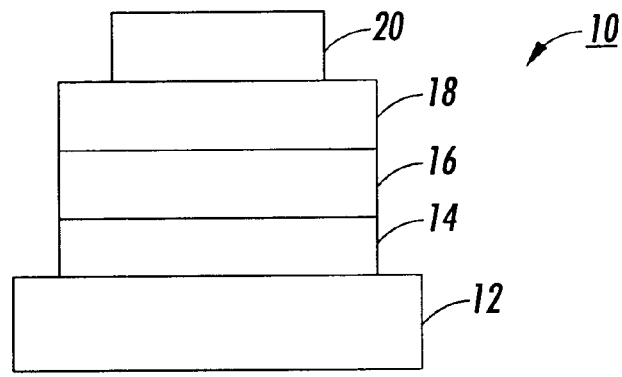
FIG. 1 illustrates a conventional organic light emitting device.

For comparative purposes, conventional bi-layer organic light emitting devices having a structure as shown in FIG. 1 were formed from the same materials and fabricated during the same vacuum cycle on the same substrates, as the organic light emitting devices according to this invention. The conventional organic light emitting devices were also tested under the same conditions as the organic light emitting devices formed according to this invention.

Figure 4A:
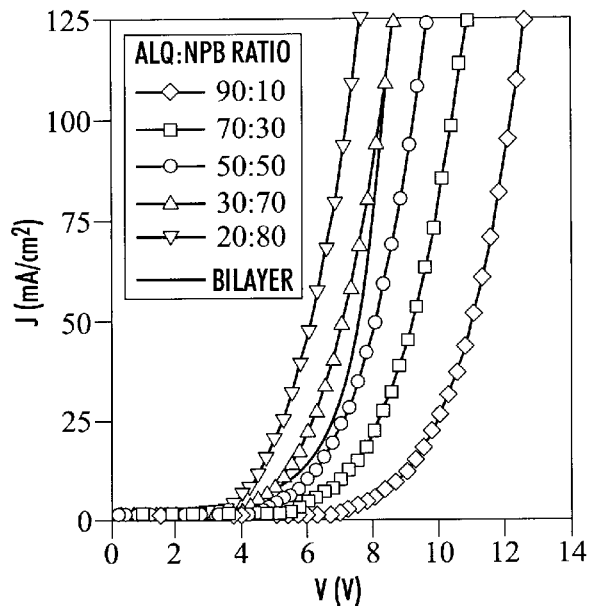
FIG. 4A illustrates the current density (J) versus voltage (V) characteristics of organic light emitting devices having different mixed region compositions according to this invention and also a conventional organic light emitting device.
Figure 4B:
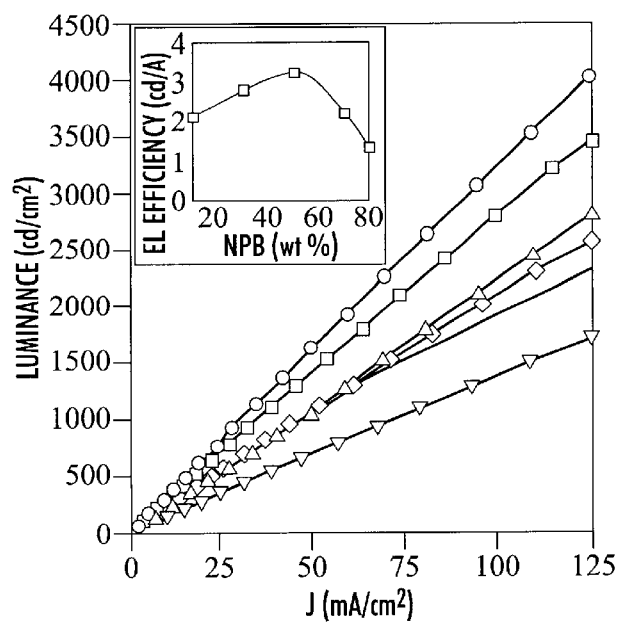
FIG. 4B illustrates the luminance (L) versus current density (J) characteristics of the organic light emitting devices according to this invention and also the conventional organic light emitting device of FIG. 4A, and also an inset showing the electroluminescence (EL) efficiency versus hole transport material (NPB) content of the mixed region for the light emitting devices according to this invention.

FIG. 4A shows the current density versus voltage (J–V) and FIG. 4B shows the luminance versus current density (L–J) characteristics of a group of organic light emitting devices with mixed layers of various hole transport material/emitting electron transport material mixing ratios according to this invention. Particularly, these organic light emitting devices comprised mixed regions having electron transport material (Alq3):hole transport material (NPB) mixing ratios from 90:10 to 20:80. The J versus V characteristics of a conventional bi-layer device are also shown for comparison.

As shown, both the turn-on voltage and the EL efficiency (equal to the slope of the L–J linear relationship) apparently depend on the mixing ratio in the mixed region of the organic light emitting device. The highest EL efficiency was about 3.2 cd/A for a mixture ratio of 50 wt. % $Alq_3$—50 wt. % NPB (or about a 56% $Alq_3$—44% NPB mole ratio). Lower $Alq_3$/NPB mixing ratios progressively reduce the turn-on voltage. However, the highest measured energy conversion efficiency (equal to the output luminous power per unit input electrical power) also corresponded to a 50 wt. % $Alq_3$—50 wt. % NPB mixed layer and had a value of about 0.6 lm/W (at 100 $cd/m^2$ luminance).

In contrast, the conventional bi-layer organic light emitting device had an EL efficiency of about 2.1 and an energy conversion efficiency of about 0.48 lm/W (at 100 $cd/m^2$ luminance).

Thus, organic light emitting devices according to the invention with a 50 wt. % $Alq_3$—50 wt. % NPB mixed layer had about a 50% higher EL efficiency and about a 25% higher energy conversion efficiency.

Figure 5:
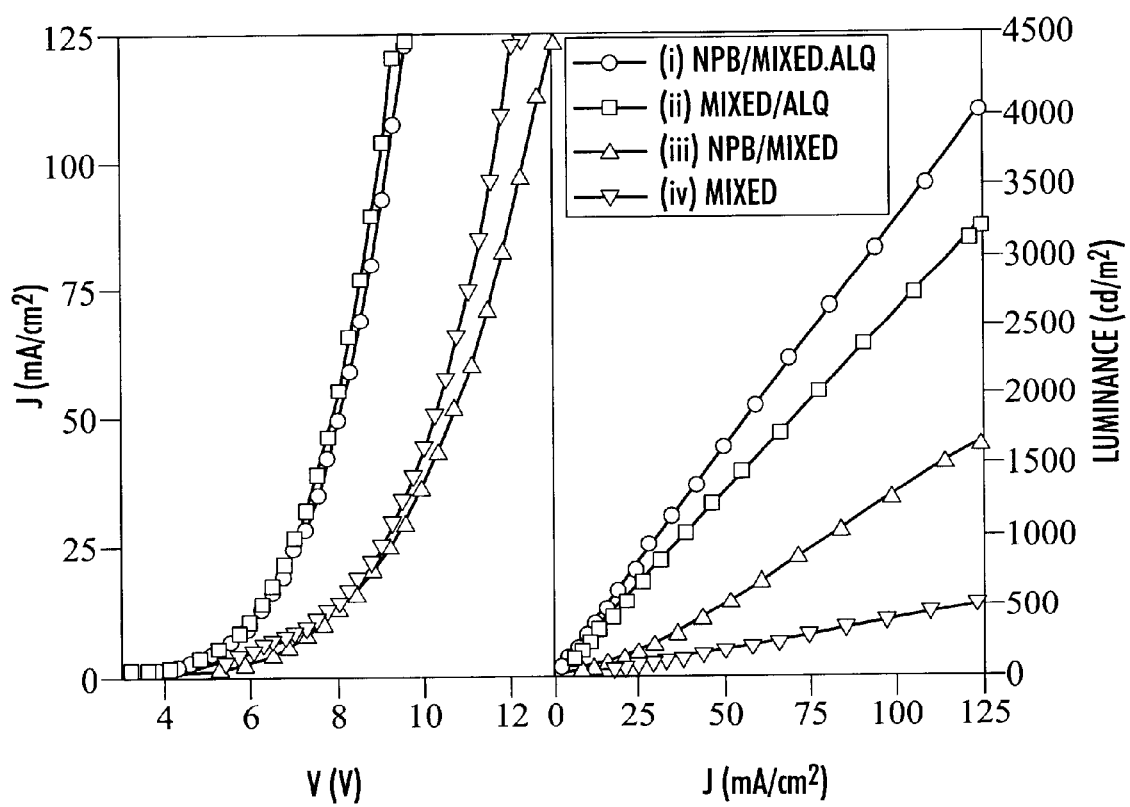
FIG. 5 illustrates the current density (J) versus voltage (V) characteristics of organic light emitting devices according to this invention including (i) a hole transport region, a mixed region and an electron transport region, (ii) a mixed region and an electron transport region and (iii) a hole transport region and a mixed region, and also a conventional light emitting device including a mixed region and no hole transport region or electron transport region (left side of figure), and the luminance (L) versus current density (J) characteristics of the organic light emitting devices according to this invention and also the conventional organic light emitting device (right side of figure)

It has previously been reported by the present inventors that organic light emitting devices including a single organic mixed layer without charge transport regions are less efficient than conventional bilayer organic light emitting devices. To investigate the role of the charge transport regions in improving the efficiency, a comparative study involving four different organic light emitting device structures was performed. Referring to FIG. 5, structure (i) included a mixed region (80 nm), a hole transport region and an electron transport region (each 20 nm). Structure (ii) included a mixed region (80 nm) and an electron transport region (20 nm), but did not include a hole transport region. Structure (iii) included a hole transport region (20 nm) and a mixed region (80 nm), but did not include an electron transport region. Structure (iv) included only a mixed region (100 nm) and did not include either a hole transport region or an electron transport region. The mixed regions of structures (i)–(iv) each had a composition of 50 wt. % NPB-50 wt. % $Alq_3$.

As shown in the left curve in FIG. 5, the turn-on voltage dropped on introducing the $Alq_3$ electron transport region, but remained almost unchanged on inserting the NPB hole transfer region. Contrary to the high hole injection rates across the anode/mixed-region interface, which remain unchanged with or without a hole transport region, electron injection rates across the cathode/mixed region interface are much lower, but can be increased by forming the $Alq_3$ layer.

On the other hand, referring to the plot of L versus J on the right side of FIG. 5, the higher EL efficiency of structures (i) and (iii) relative to structures (ii) and (iv), respectively, shows that the NPB layer reduces the leakage of carriers to the counter electrodes. The EL efficiency increases more on inserting the $Alq_3$ layer than on inserting the NPB layer (based on the higher slopes of the L–J characteristics of structure (ii) relative to (iii)) indicating that the leakage of holes at the mixed region/cathode interface is more detrimental to the EL efficiency of the organic light emitting devices than the leakage of electrons at the mixed region/anode interface. Therefore, the role of the NPB hole transport region in improving the EL efficiency is mainly limited to blocking electrons. However, the $Alq_3$ electron transport region both blocks holes and enhances electron injection. The higher EL efficiency on introducing the $Alq_3$ region may also be related to the confinement of excitons away from the metal cathode where exciton quenching can take place effectively.

Another reason for the higher efficiency of the organic light emitting devices with mixed regions for emission may be due to the rise in the quantum efficiency of the $Alq_3$ upon mixing with the NPB.

Also, pure electron and hole transport layers are believed to achieve a more balanced charge injection process, and to reduce leakage of the carriers to the counter electrodes. See Z. D. Popovic et al., *Proceedings of the SPIE*, Vol. 3476, "Organic Light-Emitting Materials and Devices II," San Diego, Calif., Jul. 21–23, 1998, pp. 68–73, incorporated herein by reference in its entirety.

Figure 6A:
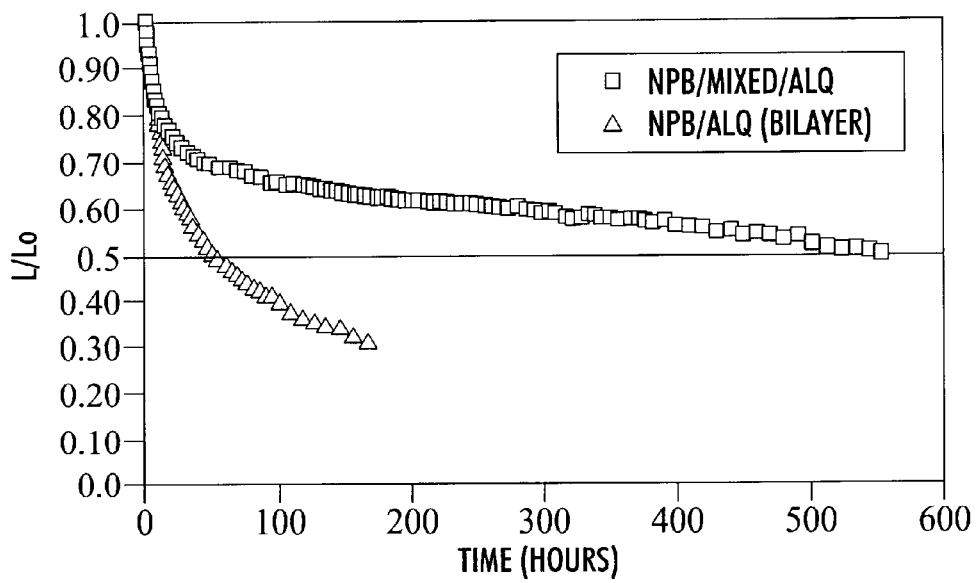
FIG. 6A illustrates the luminance (L)/initial luminance ($L_0$) versus time characteristics of an organic light emitting device according to this invention and also a conventional organic light emitting device under DC driving conditions.
Figure 6B:
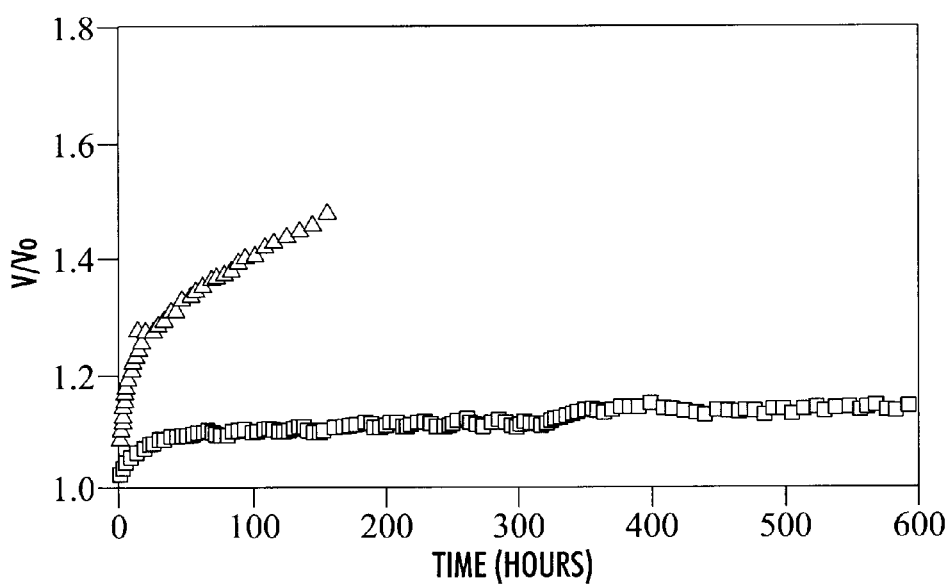
FIGS. 6B illustrates the voltage (V)/initial voltage ($V_0$) versus time characteristics of the organic light emitting device according to this invention and also the conventional organic light emitting device of FIG. 6A.

Stability tests were conducted to determine the operational lifetimes of organic light emitting devices. Referring to FIG. 6A and FIG. 6B, an organic light emitting device including an NPB layer, a mixed region and an $Alq_3$ layer, and also a conventional organic light emitting device structure including a NPB layer and an $Alq_3$ layer, but no mixed region, were tested. Both devices were stressed at 25 $mA/cm^2$ under DC driving conditions. The test results shown in these FIGS. demonstrated that the organic light emitting devices including a mixed region can provide a lifetime of about an order of magnitude longer than conventional bi-layer devices. That is, the half-lifetime (time elapsed before the luminance of an organic light emitting device drops to half its initial value) was about 550 hours for the organic light emitting devices comprising a mixed layer, as compared to only about 45 hours for bi-layer organic light emitting devices fabricated during the same vacuum cycle on the same substrate and operated at the same current density.

The initial luminance of the organic light emitting device with the mixed layers was higher (770 $cd/m^2$ compared to 510 $cd/m^2$ for the conventional organic light emitting device). Thus, the difference between the operational lifetimes is expected to be even bigger under normal operating conditions, typically at about 100 cd/m².

In addition, as shown in FIG. 6B, the rate of increase of the driving voltage of the organic light emitting device according to this invention with a mixed region was much lower than the driving voltage of the conventional bi-layer device. The stability enhancement provided by the organic light emitting devices according to this invention are attributed to the mixed region facilitating the direct recombination of holes on the hole transport molecule and the anionic species of the emitting electron transport material, and thus reducing the concentration and lifetime of the unstable cationic species of the emitting electron transport material. See, H. Aziz et al., *Science* 283, 1900 (1999), incorporated herein by reference in its entirety.

The stability enhancement is also attributed to the role of pure hole transport and electron transport regions, on both sides of the mixed region, in reducing the direct injection of holes into the neutral species of the emitting electron transport material, and the stabilization of the organic/cathode interface, respectively.

Figure 7A:
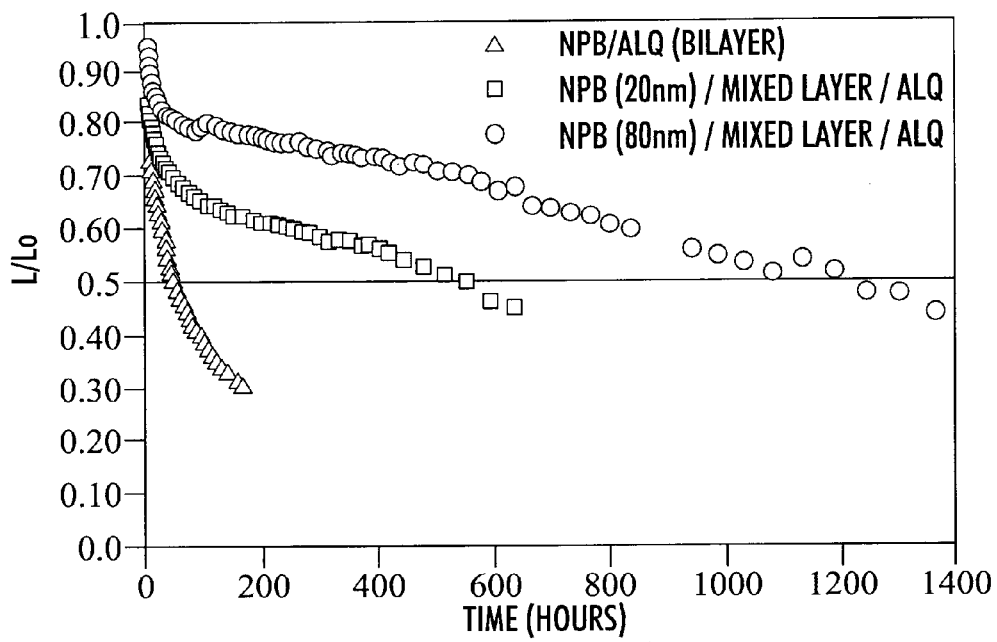
FIG. 7A illustrates the luminance (L)/initial luminance ($L_0$) versus time characteristics of two organic light emitting devices according to this invention having hole transport materials of different thickness formed on the mixed region and also a conventional organic light emitting device.
Figure 7B:
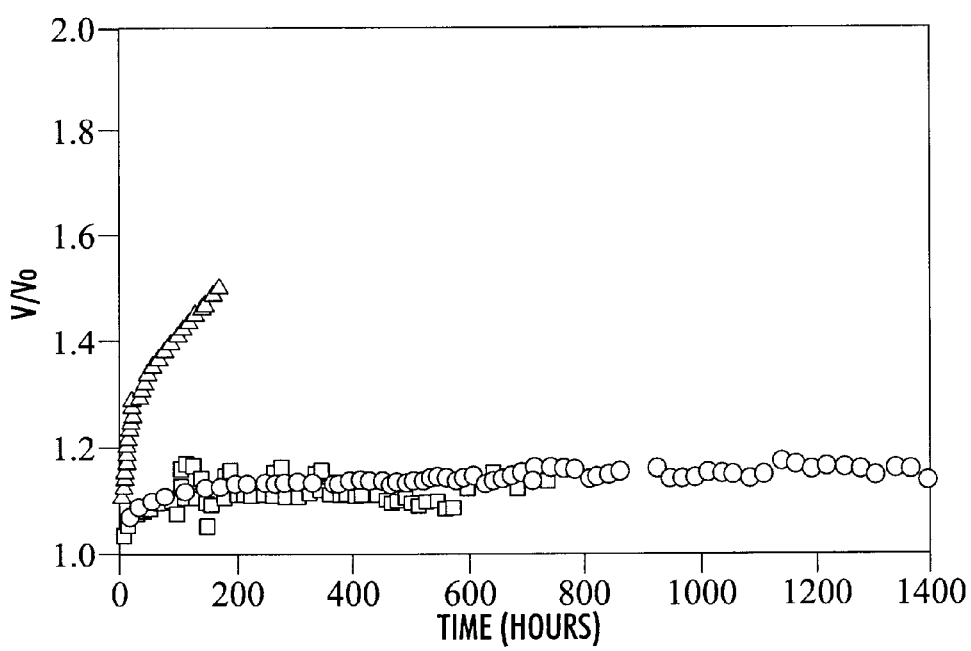
FIGS. 7B illustrates the voltage (V)/initial voltage ($V_0$) versus time characteristics of the organic light emitting devices according to this invention and also the conventional organic light emitting device of FIG. 7A.

Tests were also conducted to demonstrate the effect of the thickness of the hole transport region on performance of organic light emitting devices according to this invention. These tests were conducted using 25 mA/cm² DC driving conditions. As shown in FIG. 7A and FIG. 7B, organic light emitting devices according to this invention comprising an NPB region, a mixed region and an $Alq_3$ region and having a respective hole transport region thickness of 80 nm (initial luminance of 810 cd/m² and initial driving voltage of 7.4 V) and 20 nm (initial luminance of 770 cd/m² and initial driving voltage of 7 V), and a conventional bi-layer organic light emitting device (initial luminance of 510 cd/m² and initial driving voltage of 6.5 V), were fabricated and tested to determine their $L/L_o$ versus time and $V/V_o$ versus time characteristics. As shown in FIG. 7A, the device hole transport region having a thickness of 80 nm demonstrated a substantially higher lifetime than the device with the hole transport region having a thickness of 20 nm, and also the conventional device.

As shown in FIG. 7B, the driving voltage characteristics of the two organic light emitting devices according to this invention were similar and substantially better than the characteristics for the conventional bi-layer device.

Figure 8:
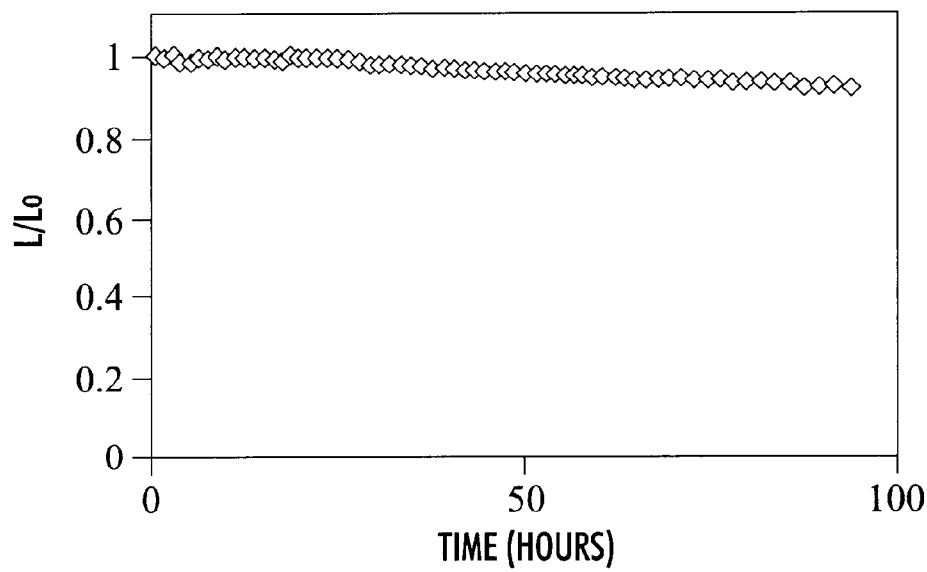
FIG. 8 illustrates the luminance (L)/initial luminance ($L_0$) versus time characteristics of an organic light emitting device according to this invention under AC driving conditions.

Tests were also conducted under AC driving conditions to determine the effect of AC versus DC driving conditions on device lifetime, as represented by the $L/L_o$ versus time characteristics. The organic light emitting device comprised a mixed region disposed between hole transport and electron transport regions. The device was tested at a high temperature of 70° C. under an accelerated driving condition of 67.5 mA/cm² with an initial light intensity of about 650 cd/m². As shown in FIG. 8, the device maintained more than 90% of its initial light intensity after continuous operation for about 100 hours. From this result, it may be expected that at a normal display level of about 100 cd/m², the operation life time at this temperature would exceed about 4000 hours.

As explained above, known methods to improve device lifetime in organic light emitting devices lose their effectiveness at higher temperatures. Thus, the present invention achieves high operational stability at high temperatures, which is required for a number of various potential technological applications of organic light emitting devices.

In addition, the organic light emitting devices provide enhanced device lifetimes at room temperature conditions than known devices that use, for example, a buffer layer at the hole injecting contact.

Figure 9:
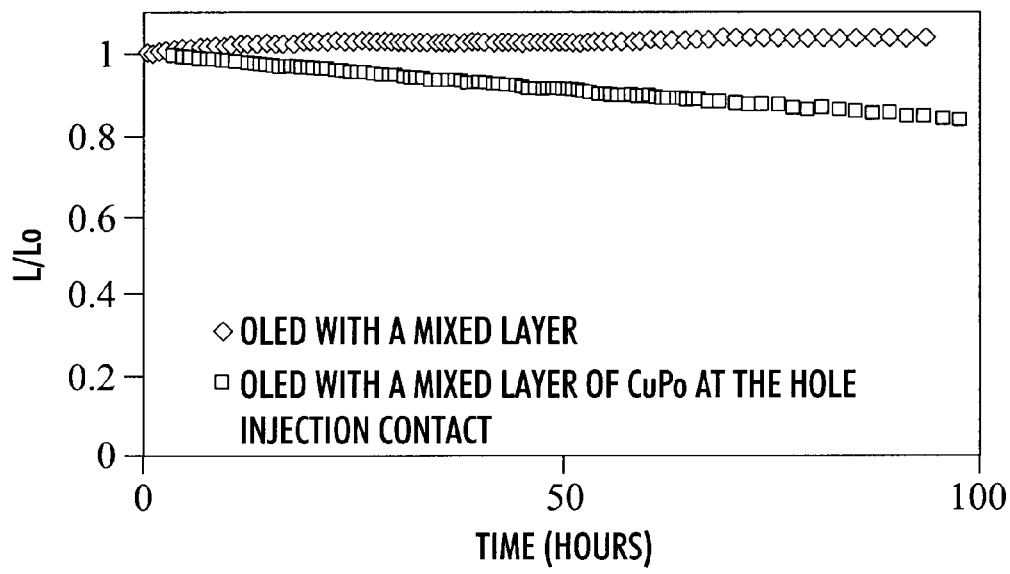
FIG. 9 illustrates the luminance (L)/initial luminance ($L_0$) versus time characteristics of an organic light emitting device according to this invention including a mixed region and an organic light emitting device comprising a buffer layer of copper phthalocyanine at the hole injection contact operated at room temperature under AC driving conditions.

In a control experiment, a device comprising a structure of ITO/buffer layer of copper phthalocyanine (15 nm)/NPB (60 nm)/$Alq_3$ (75 nm)/cathode of Mg:Ag was fabricated and tested under the same conditions as an organic light emitting device having a structure shown in FIG. 2. Both devices comprised NPB as the hole transport material and $Alq_3$ as the electron transport material. The organic light emitting device according to this invention exhibited improved operational stability at room temperature (e.g., about 25° C.) as illustrated in FIG. 9.

Thus, organic light emitting devices according to this invention provide electroluminescence from a mixed region of a hole transport material and an emitting electron transport material, placed between at least one of a hole transport region and an electron transport region. Compared to conventional bi-layer organic light emitting devices (i.e., devices without a mixed layer) comprising the same materials, the organic light emitting devices according to this invention provide higher EL efficiency and an increase in operational lifetime, at normal operating temperatures as well as at high temperature conditions.

The organic light emitting devices according to this invention can be used in various normal temperature condition technological applications. Furthermore, the high-temperature operational stability of the organic light emitting devices enables the devices to be used at high temperatures and in harsh conditions. For example, the devices can be used in various types of displays such as, for example, in automobiles and other types of vehicles, computer monitors, televisions and other like electronic devices and systems. Moreover, the devices can be used in harsh conditions such as in industrial applications where high temperatures are often present. The devices provide stable performance at high temperatures of at least, for example, 50° C. or higher, or even 70° C., or higher for extended lifetimes. Thus, the organic light emitting devices according to this invention can be used in applications in which conventional bi-layer devices would not be suitable. In addition, the organic light emitting devices according to this invention provide improved performance as compared to conventional devices at normal operating temperatures.

While the invention has been described in conjunction with the specific embodiments described above, it is evident that many alternatives, modifications and variations are apparent to those skilled in the art. Accordingly, the preferred embodiments of the invention as set forth above are intended to be illustrative and not limiting. Various changes can be made without departing from the spirit and scope of the invention.

What is claimed is:

1. An organic light emitting device, comprising:
    a mixed region comprising a mixture of a hole transport material and an electron transport material, only one of the hole transport material and the electron transport material being an emitter, the mixed region having a first surface and a second surface;
    at least one of (i) a hole transport material on the first surface, and (ii) an electron transport material on the second surface;
    an anode in contact with the hole transport material on the first surface or with the first surface; and
    a cathode in contact with the electron transport material on the second surface or with the second surface.

2. The organic light emitting device of claim 1, comprising the hole transport material on the first surface and the electron transport material on the second surface.

3. The organic light emitting device of claim 2, wherein the hole transport material on the first surface and the electron transport material on the second surface each comprise a plurality of layers.

4. The organic light emitting device of claim 1, comprising the hole transport material on the first surface, and no electron transport material on the second surface.

5. The organic light emitting device of claim 1, comprising the electron transport material on the second surface, and no hole transport material on the first surface.

6. The organic light emitting device of claim 1, wherein at least one of the hole transport material on the first surface, the electron transport material on the second surface and the mixed region comprises a plurality of layers.

7. The organic light emitting device of claim 1, comprising the hole transport material on the first surface, and wherein the hole transport material of the mixed region and the hole transport material on the first surface are the same material.

8. The organic light emitting device of claim 1, comprising the hole transport material on the first surface, and wherein the hole transport material of the mixed region and the hole transport material on the first surface are different materials.

9. The organic light emitting device of claim 1, comprising the electron transport material on the second surface, and wherein the electron transport material of the mixed region and the electron transport material on the second surface are the same material.

10. The organic light emitting device of claim 1, comprising the electron transport material on the second surface, and wherein the electron transport material of the mixed region and the electron transport material on the second surface are different materials.

11. The organic light emitting device of claim 1, wherein the mixed region comprises from about 10 wt. % to about 90 wt. % of the hole transport material and from about 90 wt. % to about 10 wt. % of the electron transport material.

12. The organic light emitting device of claim 1, wherein the mixed region comprises from about 30 wt. % to about 70 wt. % of the hole transport material and from about 70 wt. % to about 30 wt. % of the electron transport material.

13. The organic light emitting device of claim 1, wherein the device emits light having a wavelength of from about 400 nm to about 700 nm.

14. The organic light emitting device of claim 1, wherein the device operates under AC or DC driving conditions.

15. The organic light emitting device of claim 1, comprising:
the hole transport material on the first surface, the hole transport material having a thickness of from about 5 nm to about 500 nm on the first surface; and
the electron transport material on the second surface.

16. The organic light emitting device of claim 15, wherein the hole transport material has a thickness of from about 20 nm to about 80 nm on the first surface.

17. The organic light emitting device of claim 1, wherein the hole transport material of the mixed region comprises a tertiary aromatic amine, and the electron transport material of the mixed region comprises a metal chelate compound of 8-hydroxyquinoline, or a stilbene derivative.

18. The organic light emitting device of claim 1, wherein the hole transport material of the mixed region comprises a naphtyl-substituted benzidine derivative, and the electron transport material of the mixed region comprises tris (8-hydroxyquinoline) aluminum.

19. A display comprising at least one organic light emitting device according to claim 1.

20. An organic light emitting device, comprising:
an anode;
a cathode; and
a mixed region between the anode and the cathode, the mixed region comprising a mixture of a hole transport material and an electron transport material, only one of the hole transport material and the electron transport material being an emitter;
wherein the organic light emitting device can be operated at a temperature of at least about 50° C. for at least about 100 hours.

21. The organic light emitting device of claim 20, wherein the mixed region comprises from about 10 wt. % to about 90 wt. % of the hole transport material and from about 90 wt. % to about 10 wt. % of the electron transport material.

22. The organic light emitting device of claim 20, wherein the mixed region comprises a first surface and a second surface, and the organic light emitting device further comprises:
at least one of (i) a hole transport material on the first surface, and (ii) an electron transport material on the second surface;
wherein the anode contacts the hole transport material on the first surface or contacts the first surface; and
wherein the cathode contacts the electron transport material on the second surface or contacts the second surface.

23. The organic light emitting device of claim 20, wherein the hole transport material comprises a tertiary aromatic amine, and the electron transport material comprises a metal chelate compound of 8-hydroxyquinoline, or a stilbene derivative.

24. A method of making an organic light emitting device, comprising:
forming a mixed region comprising a mixture of a hole transport material and an electron transport material, only one of the hole transport material and the electron transport material being an emitter, the mixed region having a first surface and a second surface;
forming at least one of (i) a hole transport material on the first surface, and (ii) an electron transport material on the second surface;
forming an anode in contact with the hole transport material on the first surface or in contact with the first surface; and
forming a cathode in contact with the electron transport material on the second surface or in contact with the second surface.

25. The method of claim 24, further comprising forming a hole transport material on the first surface and an electron transport material on the second surface.

26. The method of claim 25, further comprising forming at least one of the hole transport material on the first surface, the electron transport material on the second surface and the mixed region with a plurality of individual layers.

27. The method of claim 25, further comprising forming the hole transport material on the first surface and the emitting electron transport material on the second surface with a plurality of separate layers.

28. The method of claim 24, further comprising forming a hole transport material on the first surface, and not forming an electron transport material on the second surface.

29. The method of claim 24, further comprising forming an electron transport material on the second surface, and not forming a hole transport material on the first surface.

30. The method of claim 24, further comprising forming the hole transport material of the mixed region and the hole transport material on the first surface from the same material.

31. The method of claim 24, further comprising forming the hole transport material of the mixed region and the hole transport material on the first surface from different materials.

32. The method of claim 24, further comprising forming the electron transport material of the mixed region and the electron transport material on the second surface from the same material.

33. The method of claim 24, further comprising forming the electron transport material of the mixed region and the electron transport material on the second surface from different materials.

34. The method of claim 24, wherein the mixed region comprises from about 10 wt. % to about 90 wt. % of the hole transport material and from about 90 wt. % to about 10 wt. % of the electron transport material.

35. The method of claim 24, wherein the hole transport material comprises a tertiary aromatic amine, and the electron transport material comprises a metal chelate compound of 8-hydroxyquinoline, or a stilbene derivative.

36. The method of claim 24, wherein the organic light emitting device emits light having a wavelength in the range of from about 400 nm to about 700 nm.

* * * * *